United States Patent
Blomqvist et al.

(10) Patent No.: US 12,420,340 B2
(45) Date of Patent: Sep. 23, 2025

(54) METHOD OF TREATING A CUTTING TOOL, AND A CUTTING TOOL

(71) Applicant: AB SANDVIK COROMANT, Sandviken (SE)

(72) Inventors: Andreas Blomqvist, Uppsala (SE); Erik Holmstrom, Huddinge (SE); Jose Luis Garcia, Stockholm (SE)

(73) Assignee: AB Sandvik Coromant, Sandviken (SE)

( * ) Notice: Subject to any disclaimer, the term of this patent is extended or adjusted under 35 U.S.C. 154(b) by 1109 days.

(21) Appl. No.: 17/252,994

(22) PCT Filed: Jun. 28, 2019

(86) PCT No.: PCT/EP2019/067455
§ 371 (c)(1),
(2) Date: Dec. 16, 2020

(87) PCT Pub. No.: WO2020/002664
PCT Pub. Date: Jan. 2, 2020

(65) Prior Publication Data
US 2021/0114116 A1 Apr. 22, 2021

(30) Foreign Application Priority Data

Jun. 29, 2018 (EP) ..................................... 18180763
Jun. 29, 2018 (EP) ..................................... 18180801
Jun. 29, 2018 (EP) ..................................... 18180803

(51) Int. Cl.
*B23B 27/16* (2006.01)
*C21D 7/06* (2006.01)
*C22C 29/08* (2006.01)

(52) U.S. Cl.
CPC ............. *B23B 27/16* (2013.01); *C21D 7/06* (2013.01); *C22C 29/08* (2013.01); *B23B 2228/04* (2013.01); *B23B 2228/08* (2013.01)

(58) Field of Classification Search
None
See application file for complete search history.

(56) References Cited

U.S. PATENT DOCUMENTS 3,573,023 A * 3/1971 Thomas et al. ....... C04B 41/009
                                                        65/61
4,674,365 A     6/1987   Reed
(Continued)

FOREIGN PATENT DOCUMENTS

CN     109952169 A * 6/2019 ............. B23B 27/14
DE     102012107129 A1   2/2014
(Continued)

OTHER PUBLICATIONS

English translation of JP-2013244549-A, date Dec. 9, 2013.*
(Continued)

*Primary Examiner* — Hwei-Siu C Payer
(74) *Attorney, Agent, or Firm* — Corinne R. Gorski

(57) ABSTRACT

The present disclosure relates to a method of treating a cutting tool of a cemented carbide or cermet substrate, wherein the cutting tool is subjected to shot peening at a temperature of or above 100° C. The cutting tool typically has a rake face, a flank face and a cutting edge extending therebetween. The shot peening is performed at least on the rake face of the cutting tool. The present disclosure also relates to a cutting tool treated with the method.

19 Claims, 1 Drawing Sheet

(56) References Cited

U.S. PATENT DOCUMENTS

| | | | |
|---|---|---|---|
| 9,566,649 B2 | 2/2017 | Hirano | |
| 2006/0051618 A1 | 3/2006 | Festeau et al. | |
| 2009/0297835 A1* | 12/2009 | Okada | C23C 16/403 |
| | | | 428/697 |
| 2011/0135414 A1 | 6/2011 | Pfeiffer et al. | |
| 2016/0144483 A1 | 5/2016 | Kasonde et al. | |
| 2016/0263659 A1* | 9/2016 | Takahashi | C23C 16/06 |
| 2016/0318808 A1* | 11/2016 | Kasonde | C04B 35/6303 |
| 2017/0314089 A1 | 11/2017 | Wang | |
| 2018/0057934 A1 | 3/2018 | Cooper et al. | |
| 2018/0117679 A1* | 5/2018 | Satoh | C23C 16/34 |
| 2018/0127874 A1* | 5/2018 | Satoh | C23C 28/042 |
| 2021/0114116 A1* | 4/2021 | Blomqvist | B24C 1/10 |
| 2023/0036990 A1* | 2/2023 | Arvanitidis | C23C 24/045 |
| 2023/0093032 A1* | 3/2023 | Bjormander | C23C 28/42 |
| | | | 407/119 |

FOREIGN PATENT DOCUMENTS

| | | | | |
|---|---|---|---|---|
| EP | 1201773 A1 * | 5/2002 | | C21D 7/06 |
| EP | 1792691 A1 | 6/2007 | | |
| EP | 2444203 A1 | 4/2012 | | |
| EP | 2594352 A1 | 5/2013 | | |
| EP | 2401099 B1 | 9/2013 | | |
| JP | S61264105 A | 11/1986 | | |
| JP | 6-240303 | * | 8/1994 | |
| JP | H06240303 | | 8/1994 | |
| JP | 2007284751 A | 11/2007 | | |
| JP | 2008207279 A | 9/2008 | | |
| JP | 2013244549 A | * | 12/2013 | |
| KR | 200490191 A | 3/2004 | | |
| WO | 2017108610 A1 | 6/2017 | | |
| WO | WO-2018060125 A1 * | 4/2018 | | B22F 3/15 |

OTHER PUBLICATIONS

English translation of JP 6-240303, date Aug. 30, 1994.*
English translation of CN-109952169-A, date Jun. 28, 2019.*
English translation of JPS61264105A, dated Nov. 22, 1986.*
"Heat Treatment Cracks and Deformation of Steel". Heat Treatment Cracks and Deformation of Steel Collegial Panel, China Machine Press. pp 146-148.
Lee et al. "The Improvement of Compressive Residual Stress by Warm Shot Peening". Department of Automobile, Kyonggi Institute of Technology, Shihung-City, Kyonggi-Do, Korea, Aug. 15, 2004.

* cited by examiner

METHOD OF TREATING A CUTTING TOOL, AND A CUTTING TOOL

RELATED APPLICATION DATA

This application is a § 371 National Stage Application of PCT International Application No. PCT/EP2019/067455 filed Jun. 28, 2019 claiming priority to EP 18180763.7 filed Jun. 29, 2018, priority to EP 18180801.5 filed Jun. 29, 2018, and priority to EP 18180803.1 filed Jun. 29, 2018.

TECHNICAL FIELD

The present invention relates to a method of treating a cutting tool comprising a cemented carbide or cermet substrate wherein the cutting tool is subjected to shot peening at an elevated temperature. The present invention also relates to a cutting tool that has been subjected to shot peening at an elevated temperature.

BACKGROUND

Cutting tools for metal cutting applications are commonly composed of a substrate of cermet or cemented carbide and the substrate is often coated with a wear resistant coating to increase the life time and performance of the cutting tool. To further improve the cutting tool, it is known to treat the cutting tool in a sometimes called post treatment, including steps such as wet blasting, dry blasting, edge brushing and/or polishing. These processes typically change the surface roughness of the cutting tool and/or the residual stresses in the substrate and/or in the coatings.

Effects of shot peening of cemented carbide is described by Wang et al., "Effect of shot peening on the residual stresses and microstructure of tungsten cemented carbide", Materials and Design 95, year 2016, pages 159-164. It is shown that compressive residual stresses are induced in the surface layer, both in the Co and in the WC.

There is a continuous need of improving the life times and performance of cutting tools to save time in production and reduce the risks of failure due to broken cutting tools.

SUMMARY OF THE INVENTION

It is an object of the present invention to provide a method of making a cutting tool with improved resistance to wear in metal cutting applications. It is a further object of the present invention to provide a method of making a milling tool with high resistance to chipping of a coating at the cutting edge.

The present invention relates to a method of treating a cutting tool comprising a cemented carbide or cermet substrate wherein the cutting tool is subjected to shot peening at a temperature of or above 100° C., preferably at a temperature of or above 200° C., more preferably at a temperature of between 200° C. and 450° C. The portion of the substrate that is subjected to shot peening is at said temperature. It has unexpectedly been found that treating a cutting tool to shot peening when it is heated increases its lifetime in cutting.

In one embodiment of the present invention the cutting tool is subjected to shot peening at a temperature of between 150-250° C., preferably at a temperature of between 175-225° C.

In one embodiment of the present invention the cutting tool is subjected to shot peening at a temperature of between 300-600° C., preferably at a temperature of between 350-550° C., more preferably of between 450-550° C.

The shot peening of the present invention is performed at an elevated temperature, and this temperature is herein defined as the temperature that the material (the portion of the cutting tool) that is shot peened is at during the shot peening. Several methods can be used to create the elevated temperature of the cutting tool portion, such as induction heating, resistance heating, pre-heating on a hot surface/oven, laser heating etc. The cutting tool can alternatively be heated in a separate step prior to the shot peening step.

In one embodiment of the present invention the cutting tool comprises a rake face, a flank face and a cutting edge there between, and wherein said shot peening is performed at least on the rake face. Rake face peening is advantageous in that it is at the rake face that the working material hits the cutting tool during the cutting operation and that the mechanisms during peening that is influencing the substrate is therefore applied at a relevant area or volume of the substrate. It is further advantageous to apply the shot peening at the rake face since for many cutting tool geometries this imply treating several cutting edges at the same time.

In one embodiment of the present invention an ER of at least a part of said cutting edge is between 10 µm and 50 µm, preferably between 20 µm and 40 µm. It has surprisingly been shown that the cutting tools made according to present method is performing well on cutting tools with this ER.

In one embodiment of the present invention the metallic binder phase content in the cemented carbide or cermet is 1-30 vol %, preferably 3-25 vol %. The binder phase content is to be high enough to provide a tough behaviour of the cutting tool. The metallic binder phase content is preferably not higher than 30 vol %, preferably not higher than 25 vol %. A too high content of binder phase reduces the hardness and wear resistance of the cutting tool.

In one embodiment of the present invention the metallic binder phase is an alloy comprising at least 80 wt % of one or more metallic elements selected from Co, Ni and Fe.

In one embodiment of the present invention the metallic binder phase is an alloy comprising one or more metallic elements selected from Co, Ni, Fe, Al, Cr, Mn, Ru, W, Mo, Re, Ti, Ta, Nb, Zr, Hf, Cu and Si, preferably selected from Co, Ni, Fe, Al, Cr, Ti and Ta, most preferably selected from Co, Ni, Fe, Al and Cr.

In one embodiment of the present invention the cutting tool is provided with a coating. The coating can be a colour layer or a wear resistant coating.

In one embodiment of the present invention the thickness of the coating is 2-20 µm, preferably 5-10 µm.

In one embodiment of the present invention the shot peening is performed with a peening media comprising beads of $ZrO_2$, steel or cemented carbide, preferably beads of $ZrO_2$.

In one embodiment of the present invention the shot peening is performed with a peening media of an average diameter of 70-150 µm. If the beads are too large the risk of damaging the cutting edge is increased. If the beads are too small the energy and impact transferred from the media to the substrate is less pronounced.

In one embodiment of the present invention the coating is a CVD coating or a PVD coating, preferably said coating comprising one or more layers selected from TiN, TiCN, TiC, TiAlN, $Al_2O_3$ and ZrCN. The coating is preferably a CVD coating comprising a TiCN layer and a $Al_2O_3$ layer.

In one embodiment of the present invention the shot peening is performed on heated cutting tools, the method comprises a step prior to the shot peening wherein said cutting tools are heated.

In one embodiment of the present invention the method further comprises a step of shot blasting at least a portion of the cutting tool. Preferably the portion includes at least a section of the cutting edge or an area close to the cutting edge.

In one embodiment of the present invention the step of shot blasting is performed subsequent to the shot peening. The heat during the shot peening can reduce some positive effect from the shot blasting, such as residual stress induction in a coating, so by choosing to do the shot peening before the shot blasting both positive effects can be maintained.

In one embodiment of the present invention the shot blasting and the shot peening are performed on the same portions of the cutting tool. This is advantageous for example during a production in large scale due to a more effective loading of the cutting tools.

The present invention also relates to a cutting tool for a metal cutting application treated with the method of the present invention.

In one embodiment of the present invention the shot peening process can be applied to any cutting tool comprising a cemented carbide substrate with a Co binder phase where the cemented carbide substrate comprises Cr.

In one embodiment of the present invention the cemented carbide comprises at least 50 wt % WC, possibly other hard constituents common in the art of making cemented carbides, and between 3 to 20 wt % of a Co binder phase.

In one embodiment of the present invention the Co is the main constituent in the binder apart from elements that is dissolved in the Co binder during sintering e.g. Cr and W and C originating from the WC. Depending on what other types of hard constituents that are present, also other elements can be dissolved in the binder. The amount of Co in the cemented carbide is suitably between 3 to 20 wt %, preferably between 3 to 12 wt %.

In one embodiment of the present invention the other hard constituents is e.g. grain growth inhibitors, gamma phase formers etc. Common additives are carbides, nitrides or carbonitrides of Ti, Ta, Nb, Zr and V.

In one embodiment of the present invention, the Co binder phase comprises Cr in an amount so that the Cr/Co weight ratio is between 0.03 to 0.35, preferably 0.07 to 0.20.

In one embodiment of the present invention, the cemented carbide comprises $M_7C_3$ carbides, and possibly also $M_3C_2$ carbides, where M is Cr and possibly one or more of W, Co and any other elements added to the cemented carbide. By that is herein meant that the $M_7C_3$ carbides should be clearly visible in a SEM (scanning electron microscope) image using backscattering at a magnification enough to detect particles of a size of 100 nm.

In one embodiment of the present invention, the cemented carbide comprises $M_7C_3$ carbides in an amount given by the ratio vol % $M_7C_3$ carbides/vol % Co. Suitably the ratio vol % $M_7C_3$ carbides/vol % Co is between 0.01 to 0.5 preferably between 0.03 to 0.25. The vol % of $M_7C_3$ carbides and the Co binder can be measured by EBSD or image analysis using a suitable software e.g. Image J.

In one embodiment of the present invention the method of treating a cutting tool comprise a cemented carbide substrate comprising a metallic binder phase wherein the cemented carbide have a substoichiometric carbon content, SCC, of $-0.13$ wt %$\leq$SCC$<0$ wt %, or $-0.30$ wt %$\leq$SCC$\leq-0.16$ wt %, and wherein the cutting tool is subjected to a shot peening process at a temperature of or above 100° C., preferably, preferably at a temperature of or above 200° C., more preferably at a temperature of between 200° C. and 450° C. The portion of the substrate that is subjected to shot peening is at said temperature. It has unexpectedly been found that treating a cutting tool to shot peening when it is heated increases its lifetime in cutting.

In one embodiment of the present invention the shot peening process can be applied to any cutting tool comprising a cemented carbide substrate comprising a metallic binder phase wherein the cemented carbide has a substoichiometric carbon content, SCC, of $-0.13$ wt %$\leq$SCC$<0$ wt %, or $-0.30$ wt %$\leq$SCC$\leq-0.16$ wt %.

By cemented carbide is herein meant a material that comprises at least 50 wt % WC, possibly other hard constituents common in the art of making cemented carbides and between 3 to 20 wt % of a metallic binder phase.

In one embodiment the metallic binder phase is a binder phase where the main element(s) is selected from one or more of Fe, Co and Ni, preferably Co, in an amount of 3 to 20 wt % of the cemented carbide, or between 5 to 12 wt % of the cemented carbide.

In one embodiment the binder is mainly composed of one or more of Ni, Co and Fe, except from other elements that is dissolved in the binder during sintering e.g. and W and C originating from the WC. Depending on what other types of hard constituents that are present, also other elements can be dissolved in the binder.

In one embodiment the other hard constituents common in the art is e.g. grain growth inhibitors, gamma phase formers etc. Common additives are carbides, nitrides or carbonitrides of Ti, Ta, Nb, Zr, V and Cr.

The cemented carbide substrate according to one embodiment of the present invention has a substoichiometric carbon content (SCC) within certain ranges. Substoichiometric carbon is a measure of the carbon content in relation to the stoichiometric value of carbon. The substoichiometric value is a suitable value to use since it is not dependent on other parameters like binder phase content, other carbides etc.

The term substoichiometric carbon, as used herein, is the total carbon content determined by chemical analysis minus the calculated stoichiometric carbon content based on WC and possible other carbides present in the sintered cemented carbide.

When the stoichiometric carbon content is estimated on a sintered cemented carbide, e.g. consisting of Co and WC, it can either be done based on the amount of added WC raw material, assuming that the atomic ratio W:C is 1:1, or, from measurements on the sintered material, and then from the measured tungsten content calculate the stoichiometric carbon content assuming that the atomic ratio W:C is 1:1. If other constituents are added e.g. grain growth inhibitors, gamma phase formers etc. as has been described previously, those are also assumed to be stoichiometric.

One way to determine the substoichiometric carbon content (SCC) in a WC—Co substrate is to first measure the total carbon content by using a LECO WC-600 instrument, for this analysis, the sample was crushed prior to the analysis. The accuracy of the values is ±0.01 wt %. The Co content is then measured with XRF (X-ray fluorescence) using a Malvern Panalytical Axios Max Advanced instrument. By subtracting the cobalt and carbon amounts from the total weight of the sample, the W content is achieved which is used to calculated the stoichiometric carbon content, assuming the WC has a 1:1 ratio.

As an example, if the stoichiometric carbon content for a particular cemented carbide is 5.60 wt %, and the same cemented carbide would be made, but with a carbon content of 5.30 wt %, the substoichiometric carbon would be $-0.30$ wt %.

The solubility of W in the binder phase is directly related to the carbon content. The amount of W in the binder increases with decreasing carbon content until the limit for eta phase formation is reached. If the carbon content would decrease even lower, the solubility of W in the binder will not increase further. In some cemented carbide grades where it is beneficial to obtain a high amount of W dissolved in the binder, the carbon content has been kept low but above the limit for eta phase formation.

In one embodiment, the cemented carbide has a substoichiometric carbon content −0.13 wt %≤SCC<0 wt %, preferably −0.13 wt %≤SCC≤−0.05 wt %, more preferably −0.12 wt %≤SCC≤−0.10 wt %. In this embodiment the cemented carbide is free from at least large agglomerates of eta phase, alternatively free from eta phase in any form.

In one embodiment of the present invention, the cemented carbide substrate comprises eta phase and have a substoichiometric carbon of 0.30 wt %≤SCC<−0.16 wt %, preferably −0.28 wt %≤SCC≤−0.17 wt %. If the carbon content is higher than the upper limit in this embodiment, i.e. above −0.16 but still in the eta phase forming region, the formed eta phase will be unevenly distributed like in large agglomerates leading to a decrease in toughness of the cemented carbide. The cemented carbide according to this embodiment of the present invention, should have an evenly distributed eta phase, by that is herein meant that the cemented carbide is free from large agglomerates. Preferably, the amount of eta phase is between 2 to 10 vol %, preferably between 4 and 8 vol % and more preferably between 4 to 6 vol %.

In one embodiment the cemented carbide comprises eta phase comprising $Me_{12}C$ and/or $Me_6C$ carbides where Me is one or more metals selected from W, Mo and the binder phase metals. The cemented carbide according to this embodiment has such a low carbon content so that eta phase is formed. This will result in a cemented carbide having both a high W content in the binder and eta phase. The eta phase formed is, however, not present as large agglomerates.

Commonly, eta phase has been considered as unwanted in cemented carbide due to that it has traditionally been present in large agglomerates of eta phase grains which are brittle and detrimental to the cemented carbide properties. However, by providing the non-agglomerated eta phase by selecting a certain range of substoichiometric carbon content as in the cemented carbide of this embodiment, the cemented carbide shows good properties. The eta phase is present in the microstructure as a fine dispersed phase.

Common carbides of the eta phase are $W_6Co_6C$, $W_3Co_3C$, $W_6Ni_6C$, $W_3Ni_3C$, $W_6Fe_6C$, $W_3Fe_3C$.

In one embodiment the eta phase comprises both $Me_{12}C$ and $Me_6C$.

In one embodiment, the cemented carbide has a substoichiometric carbon content −0.13 wt %≤SCC<0 wt %, preferably −0.13 wt %≤SCC≤−0.05 wt %, more preferably −0.12 wt %≤SCC≤−0.10 wt %. In this embodiment the cemented carbide is free from at least large agglomerates of eta phase, alternatively free from eta phase in any form.

The present invention also relates to a cutting tool comprising a cemented carbide or a cermet substrate, wherein the cutting tool (1) comprises a rake face (2), a flank face (3) and a cutting edge there between, and wherein the Vickers hardness as measured on the rake face is at least 25 HV100 higher, preferably 30 HV100 higher, more preferably 40 HV100 higher, than the Vickers hardness as measured in the bulk, wherein the hardness is an average of 4 parallel measurements. The hardness measured in the bulk is a hardness measurement performed at a cross section of the cutting tool. In the cutting tool of the present invention the hardness is lower in the bulk area as compared to in the surface area. An increased hardness in the surface area of the cutting tool, especially in the area of the cutting tool that is in contact with the work piece material during metal cutting applications, is advantageous in that the wear resistance of the cemented carbide or cermet is increased. Further, a coating applied on the substrate can withstand longer and thereby increase the life time of the cutting tool. In one embodiment of the present invention the cutting tool comprises a coating, and wherein the thickness of the coating in the area of the hardness measurement is 3-12 μm and preferably less than 6 μm.

In one embodiment of the present invention the grain size of the hard constituents in the substrate is evenly distributed such that no gradient in grain size distribution exists.

In one embodiment of the present invention the binder phase content in the surface area of the substrate is higher than or the equal to the binder phase content in the bulk area of the cutting tool.

In one embodiment of the present invention the composition of the cemented carbide or the cermet in the surface area corresponds to the composition in the bulk area.

The present invention also relates to a cutting tool comprising a rake face (2), a flank face (3) and a cutting edge there between, and wherein the residual stress as measured on the rake face is RS(original) and wherein the residual stress as measured after a heat treatment for 10 minutes at atmospheric pressure at 400° C. is RS(heat treated), and wherein the relation RS(heat treated)/RS(original) is ≥92%, preferably ≥95%, more preferably ≥97%. The residual stress in the surface area is compressive after the shot peening process. In one embodiment the relation RS(heat treated)/RS(original) is ≥1. A heat treatment at 400° C. clearly shows that the effect from the hot shot peening remains in the substrate even after a heat treatment. This is advantageous since an increased residual stress level in the surface area of the substrate can counteract the formation of cracks, and thereby increase the life time of the cutting tool. Cutting tools in use are exposed to heat since metal cutting creates heat. Cooling is often applied, but in many applications the heat is utilised, softening the chip during its formation, since the cutting forces can be kept relatively low.

Shot peening influences the residual stress in the substrate such that compressive stresses can be measured, for example by XRD, $sin^2\psi$-method, and studying the reflection from the 211 peak of WC. Hot shot peening has surprisingly shown to influence the residual stress in the substrate even further. It was realized that hot shot peening introduced residual stress that could withstand also a subsequent heat treatment. This is a promising property that is advantageous in cutting tools.

In one embodiment of the present invention the cutting tool comprises a cemented carbide substrate, wherein the cutting tool (1) comprises a rake face (2), a flank face (3) and a cutting edge there between, and wherein the Vickers hardness as measured on the rake face is at least 25 HV100 higher, preferably 30 HV100 higher, more preferably 40 HV100 higher, than the Vickers hardness as measured in the bulk, wherein the hardness is an average of 4 parallel measurements, said cutting tool further comprises a surface coating with thickness is 3-12 μm, said cemented carbide has 3-20 wt % binder phase comprising Co, and wherein the cemented carbide comprises Cr such that a Cr/Co weight ratio is 0.03-0.35. In one embodiment this coating is a CVD coating, preferably a CVD coating including a layer of TiCN and a layer of $Al_2O_3$.

In one embodiment of the present invention the cutting tool comprising a cemented substrate, wherein the cutting tool (1) comprises a rake face (2), a flank face (3) and a cutting edge there between, and wherein the residual stress as measured on the rake face is RS(original) and wherein the residual stress as measured after a heat treatment for 10 minutes at atmospheric pressure at 400° C. is RS(heat treated), and wherein the relation RS(heat treated)/RS(original) is ≥92%, preferably ≥95%, more preferably ≥97%, said cutting tool is provided with a CVD coating with thickness 3-12 μm, the substrate comprises at least 50 wt % WC, and between 3 to 20 wt % of a binder phase comprising Co, preferably comprising 7-10 wt % Co, optionally comprising TaC and NbC, preferably the cutting tool is provided with a CVD coating including a layer of TiCN and a layer of $Al_2O_3$.

Still other objects and features of the present invention will become apparent from the following detailed description.

DEFINITIONS

Cemented carbide and cermet are materials comprising hard constituents distributed in a continuous metallic binder phase. This kind of material has properties combining a high hardness from the hard constituents with a high toughness from the metallic binder phase and are suitable as substrate materials for metal cutting tools.

By "cemented carbide" is herein meant a material that comprises at least 50 wt % WC, possibly other hard constituents common in the art of making cemented carbides and a metallic binder phase preferably selected from one or more of Fe, Co and Ni.

By "cermet" is herein meant a material comprising a hard constituent and metallic binder phase where the hard constituent is one or more of titanium carbonitride, titanium carbide and titanium nitride. The metallic binder phase in cermet is preferably selected from one or more of Fe, Co and Ni, preferably Co. Other hard constituents common in the art of cermets are selected from carbides, nitrides or carbonitrides of Ti, Ta, Nb, Zr, V and Cr. The cermet material comprises no free hexagonal WC. Cermet materials based on titanium carbonitride are the most common cermet materials of today.

The metallic binder of the cermet or the cemented carbide can comprise other elements that are dissolved in the metallic binder during sintering, such as W and C originating from the WC.

Depending on what other types of hard constituents that are present, also other elements can be dissolved in the binder.

By "cutting tool" is herein meant a cutting tool for metal cutting applications such as an insert, an end mill or a drill. The application areas can be turning, milling or drilling.

"ER" is a value of the edge rounding intended to indicate the sharpness of the edge. Larger values of ER represent a rougher shape of the cutting edge while a smaller value of ER represent a sharp cutting edge.

ER is herein defined as a value as calculated according to the following:

- put the cutting tool on a flat surface on its bearing surface or the corresponding surface of the cutting tool.
- align a first plane along the side of the cutting tool perpendicular to said flat surface, in contact with the edge to measure, for example along the flank face 3 of the cutting tool 1,
- align a second plane in parallel with said flat surface and intersecting at an intersection point said first plane, said second plane being in contact with the edge to measure at a contact point, for example said second plane is aligned along the rake face 2 of the cutting tool 1.

Figure 2:
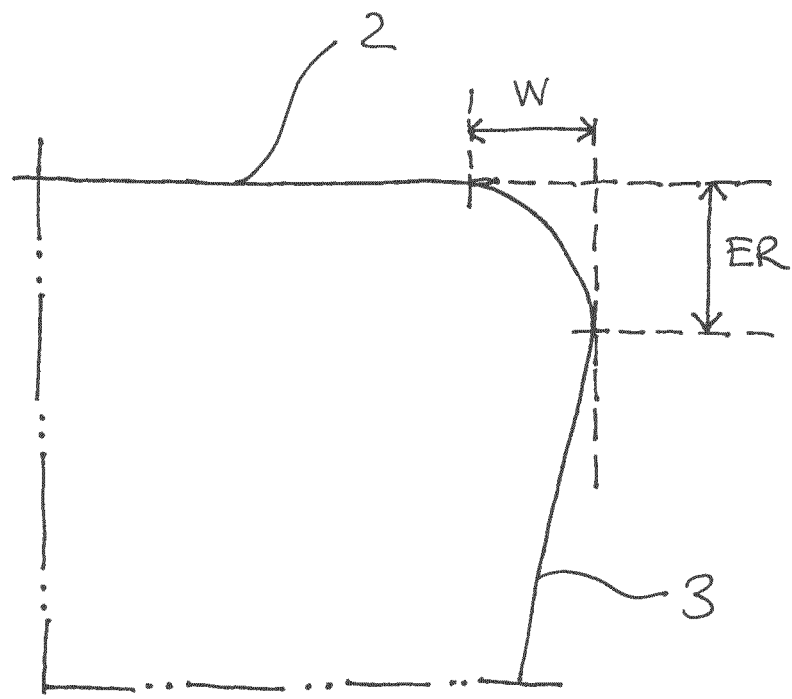
FIG. 2 is a general view of a cross section of a cutting edge.

The value "ER" is equal to the distance between the intersection point between the first and the second plane and the point of contact between the first plane and the cutting tool, close to the edge, see FIG. 2.

"Shot blasting" is herein denoted a process using abrasive grains wherein material typically is removed from the treated surface by abrasive wear. Shot blasting is well known in the field of cutting tools and is for example known to introduce residual stresses in a coating on a cutting tool.

By "Shot peening" is herein meant that the surface of a cutting tool is bombarded with a media comprising particles, so called beads, that are non-abrasive and that typically have a round shape. The media can be beads of a hard material such as an oxide, steel or cemented carbide.

By the term "bulk" is herein meant the innermost part (centre) of the cutting tool and for this disclosure is the zone having the lowest hardness.

By the term "surface area" is herein meant the outer portion of the substrate which is influenced by the shot peening process disclosed herein.

DETAILED DESCRIPTION OF THE INVENTION

Figure 1:
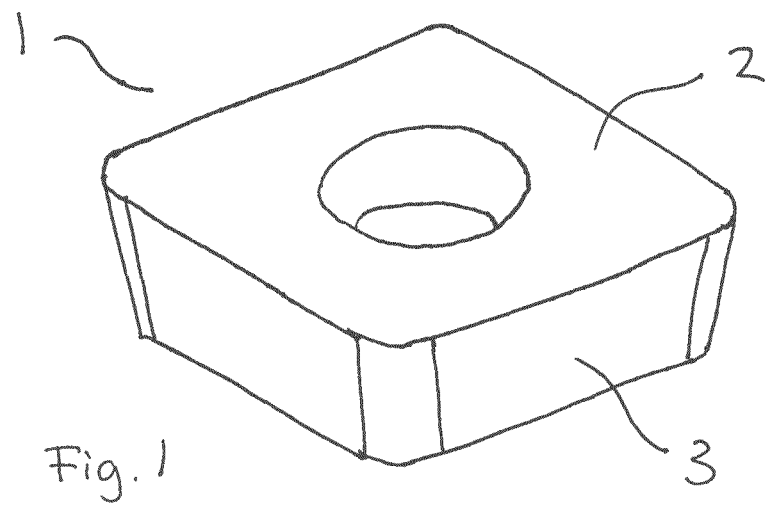
FIG. 1 is a general view of a cutting tool insert.

FIG. 1 is a general view of a cutting tool insert 1, provided with a rake face 2 and a flank face 3. A cutting edge is provided therebetween. FIG. 2 is a general view of a cross section of a cutting edge wherein the ER is indicated and also the width of the cutting edge, "w", is shown schematically.

The present invention relates to a method of treating a cutting tool 1 comprising a cemented carbide or cermet substrate wherein the cutting tool is subjected to shot peening at a temperature of or above 100° C., preferably at a temperature of or above 200° C., more preferably at a temperature of between 200° C. and 450° C. The portion of the substrate that is subjected to shot peening is at said temperature. It has unexpectedly been found that treating a cutting tool to shot peening when it is heated increases its lifetime in cutting.

The upper limit for the temperature where the shot peening is performed is preferably below the sintering temperature for the given cemented carbide or cermet, more preferably below 1200° C.

The shot peening of the present invention is performed at an elevated temperature, and this temperature is herein defined as the temperature that the material (the portion of the cutting tool) that is shot peened is at during the shot peening. Several methods can be used to create the elevated temperature of the cutting tool portion, such as induction heating, resistance heating, pre-heating on a hot surface/oven, laser heating etc. The cutting tool can alternatively be heated in a separate step prior to the shot peening step.

The temperature is suitably measured on the substrate by any method suitable for measuring temperature. Preferably, an infrared temperature measurement device is used.

In one embodiment of the present invention the cutting tool 1 comprises a rake face 2, a flank face 3 and a cutting edge there between, and wherein said shot peening is performed at least on the rake face 2. Rake face peening is advantageous in that it is at the rake face 2 that the working material hits the cutting tool during the cutting operation and that the mechanisms during peening that is influencing the substrate is therefore applied at a relevant area or volume of the substrate. It is further advantageous to apply the shot peening at the rake face 2 since for many cutting tool geometries this imply treating several cutting edges at the same time.

In one embodiment of the present invention an ER of at least a part of said cutting edge is between 10 µm and 50 µm, preferably between 20 µm and 40 µm. It has surprisingly been shown that the present method is performing well on cutting tools 1 with this ER.

In one embodiment of the present invention the metallic binder phase content in the cemented carbide or cermet is 1-30 vol %, preferably 3-25 vol %. The binder phase content is to be high enough to provide a tough behaviour of the cutting edge. The metallic binder phase content is preferably not higher than 30 vol %, preferably not higher than 25 vol %. A too high content of binder phase reduces the hardness and wear resistance of the cutting tool.

In one embodiment of the present invention the metallic binder phase is an alloy comprising at least 80 wt % of one or more metallic elements selected from Co, Ni and Fe.

In one embodiment of the present invention the metallic binder phase is an alloy comprising one or more metallic elements selected from Co, Ni, Fe, Al, Cr, Ru, W, Mo, Mn, Re, Ti, Ta, Nb, Zr, Hf, Cu, Si.

In one embodiment of the present invention the cutting tool is provided with a coating. The coating can be a colour layer or a wear resistant coating.

In one embodiment of the present invention the thickness of the coating is 1.5-25 µm, preferably 2-20 µm, more preferably 2-10 µm.

The shot peening is preferably performed in a dry process using air with the beads in it. The beads can be made of any material known in the art of shot peening, such as ceramic beads, cemented carbide beads or metallic beads. In one embodiment of the present invention the shot peening is performed with a peening media comprising beads of $ZrO_2$, steel or cemented carbide.

In one embodiment of the present invention the shot peening is performed with a peening media of an average diameter of 70-150 µm. The impact or energy from the beads during the shot peening should not be too high since this would increase the risk of damaging the surface and the cutting edge of the cutting tool. The impact or energy from the beads should neither be too low since then the technical effect would not be achieved. If the beads are too large the risk of damaging the cutting edge is increased. If the beads are too small the energy and impact transferred from the media to the substrate is less pronounced. A suitable size of the beads is related to the material of the beads and is to be selected by the skilled person.

In one embodiment of the present invention the coating is a CVD coating or a PVD coating, preferably said coating comprising one or more layers selected from TiN, TiCN, TiC, TiAlN, $Al_2O_3$ and ZrCN.

The coated cutting tool subjected to the shot peening process according to the present invention can be provided with any coating common in the art of cutting tools, suitably a PVD or CVD coating, preferably a CVD coating.

In one embodiment of the present invention, the coating is a CVD coating comprising an inner TiCN layer and an outer $\alpha$-$Al_2O_3$ layer.

In one embodiment of the present invention, the cemented carbide substrate is provided with a wear resistant PVD coating, suitably being a nitride, oxide, carbide or mixtures thereof of one or more of the elements selected from Al, Si and groups 4, 5 and 6 in the periodic table.

In one embodiment of the present invention the shot peening is performed on heated cutting tools, the method comprises a step prior to the shot peening wherein said cutting tools are heated.

In one embodiment of the present invention the method further comprises a step of shot blasting at least a portion of the cutting tool. Preferably the portion includes at least a section of the cutting edge or an area close to the cutting edge.

In one embodiment of the present invention the step of shot blasting is performed subsequent to the shot peening. The heat during the shot peening can reduce some positive effect from the shot blasting, such as residual stress induction in a coating, so by selecting to do the shot peening before the shot blasting both positive effects can be maintained.

In one embodiment of the present invention the shot blasting and the shot peening are performed on the same portions of the cutting tool. This is advantageous for example during a production in large scale due to a more effective loading of the cutting tools.

In one embodiment of the present invention the peening is performed in a shot direction that is perpendicular to the surface of the cutting tool. A perpendicular shot peening is advantageous in that the depth of the impacted substrate is the largest when the heated shot peening is in this direction.

In one embodiment of the present invention, the cutting tool 1 is an insert, preferably a milling insert.

In one embodiment of the present invention the the cemented carbide has a binder phase of Co, preferably 3-20 wt % Co in the cemented carbide, and wherein the cemented carbide comprises Cr, preferably with a Cr/Co weight ratio of 0.03-0.35, more preferably a Cr/Co weight ratio of 0.07-0.20.

In one embodiment of the present invention the cemented carbide comprises $M_7C_3$ carbides.

In one embodiment of the present invention the cemented carbide has a substoichiometric carbon content, SCC, of $-0.13$ wt % $\leq$ SCC $\leq$ 0 wt %, or $-0.30$ wt % $\leq$ SCC $\leq$ $-0.16$ wt %.

In one embodiment of the present invention the cemented carbide has a substoichiometric carbon content, SCC, of $-0.28$ wt % $\leq$ SCC $\leq$ $-0.17$ wt %, and further comprises eta phase.

The shot peening process according to the present invention can also be combined with other process steps known in the art of making cutting tools such e.g. brushing, polishing, wet blasting, dry blasting etc.

The present invention also relates to a cutting tool 1 treated with the method of the present invention.

EXAMPLES

Exemplifying embodiments of the present invention will now be disclosed in more detail and compared to comparative embodiments. Coated cutting tools (inserts) were prepared, analyzed and evaluated in cutting tests.

Example 1 (Sample Preparations)

Cutting tools of cemented carbide were prepared by forming substrates from raw materials according to table 1.

The substrates were manufactured according to conventional methods including milling, spray drying, pressing and sintering. Cutting tools of the Insert type R390-11T308M-PM and R390-11T308M-MM were formed and used in the milling tests. Also cutting tools of Insert type SNUN 19 04 16 were formed and these were used in the hardness and the residual stress measurements. Tungsten metal was added to substrate 3A and 3B in order to adjust the carbon content.

TABLE 1

Substrate compositions

| Substrate | Co (wt %) | Cr (wt %) | Cr/Co | SCC | TaC (wt %) | NbC (wt %) | WC |
|---|---|---|---|---|---|---|---|
| 1A | 9.14 | — | — | 0.01 | 1.23 | 0.30 | balance |
| 1B | 9.14 | — | — | n.a. | — | — | balance |
| 1C | 12.6 | — | — | n.a. | 1.17 | 0.28 | balance |
| 2A | 7.92 | 1.23 | 0.155 | n.a. | — | — | balance |
| 2B | 8.2 | 0.41 | 0.05 | n.a. | — | — | balance |
| 2C | 7.75 | 0.775 | 0.1 | n.a. | — | — | balance |
| 2D | 8.24 | 1.65 | 0.2 | n.a. | — | — | balance |
| 3A | 9.4 | — | — | −0.26 | — | — | balance |
| 3B | 9.14 | — | — | −0.13 | — | — | balance | n.a = not analyzed

The amount of eta phase in substrates A, 3A and 3B were determined by image analysis using the software Image J using the setup "Automatic". The images used for the analysis was LOM images with a magnification of 1000× and 2000×, two measurements were done at each magnification and the value presented below is an average value of these. The value is an average from a total of four image analyses performed on two images, 2 measurements on each image. The substrate 3A contained 4 vol % eta phase, substrates 1A and 3B contained no eta phase. The substoichiometric carbon content (SCC) was calculated for substrates 1A, 3A and 3B. and are presented in Table 1. None of the substrate contained free graphite. Except for the substrate 3A, none of the other substrate contained eta phase in the bulk area of the substrate.

Substrates 1A, 1B, 2A, 2B, 2C, 2D, 3A, and 3B were coated in the same coating process, depositing the layers TiN/TiCN/$\alpha$-Al$_2$O$_3$/TiN with CVD. The total coating thickness was about 6.6 μm.

Substrate 1C was coated in a coating process, depositing the layers TiN/TiCN/$\kappa$-Al$_2$O$_3$/TiN with CVD. The total coating thickness was about 4.2 μm.

Coated cutting tools of all the types of substrates were subjected to shot peening at elevated temperature forming samples Inventions 1A-1C, Inventions 2A-2D and Inventions 3A-3B.

Corresponding cutting tools of all the types of substrates were subjected to a shot peening at room temperature (25° C.), forming Comparatives 1A-1C, Comparatives 2A-2D and Comparative 3A-3B.

The shot peening of the samples later tested in Example 2 was performed in a IEPCO Micropeen Peenmatic 750 GSD equipment. A blasting media of ZrO$_2$ ceramic beads with a spherical shape and an average diameter of about 100 μm was used, media IEPCO MS/Z 350 B. The grain size of the ZrO$_2$ ceramic beads is 70-125 μm. The shot gun pressure was set to 5 bar, the working time was set to 20 seconds, the nozzle diameter was 8 mm and the stand-off distance was 100 mm. The peening was applied perpendicular to the rake face of the cutting tools. In the case of heated shot peening the cutting tools were heated at a resistance heater prior to the shot peening and the temperature of the cutting tools were measured with a temperature sensor.

The shot peening of the samples later tested in Examples 3 and 4 was performed in an AUER Manual Blasting Cabinet ST 700 PS equipment. A blasting media of ZrO$_2$ ceramic beads with a spherical shape and an average diameter of about 100 m was used, media Microblast®B120. The grain size of the ZrO$_2$ ceramic beads is 63-125 μm. The shot gun pressure was set to 2 bar, the working time was set to 12 seconds, the nozzle diameter was 8 mm and the stand-off distance was 100 mm. The peening was applied perpendicular to the rake face of the cutting tools. In the case of heated shot peening the cutting tools were heated with an induction coil heater prior to the shot peening and the temperature of the cutting tools were measured with a temperature sensor. The induction heater was a Rimac induction heater, 1.5 kW.

Subsequent to the shot peening all the cutting tools except 1C were subjected to a wet shot blasting treatment on the rake face of the cutting tools. The shot blasting was performed with Al$_2$O$_3$ abrasive grains with a grain size of F220. The concentration of blasting media in water was 20 vol % and the pump pressure during blasting was 1.8 bar. The blasting pressure was 2.0 bar, the time of blasting per area was about 5 seconds and the direction of the blasting was perpendicular to the rake face of the cutting tools. The distance between the shot gun and the samples (cutting tools) was about 130 mm.

The cutting tools 1C were instead edge line brushed before the shot peening.

Also, coated cutting tools according to the above that were only shot blasted or only edge brushed, i.e. not shot peened, were prepared and are hereinafter called Reference 1, Reference 2 and Reference 3.

The cutting edges of the of the cutting tools after these post-treatments are about ER 40 μm.

Example 2 (Working Example)

Inserts were then tested in a milling operation at the following parameters:

Work piece material: Dievar unhardened, PL 129 280×200×100, MC P3. 0.Z.AN, CMC 03.11, Charge: M10205
$v_c$=140 m/min
$f_z$=0.15 mm
$a_e$=12 mm
$a_p$=3.0
z=1
length of cut=12 mm
No cutting fluid was used.
Insert type R390-11T308M-PM The tool life criterion was set to chipping of at least 0.5 mm of the edge line. Tool life is presented as the average number of cut entrances in order to achieve these criteria. The average tool life is presented in Table 2 and the tool life is the average number of cuts and it is an average of 8 parallel cutting test.

TABLE 2

Summary of cutting test results of Example 2

| Name of sample | Substrate | Shot peening | Average tool life |
|---|---|---|---|
| Invention 1A | 1A | at 200° C. | 25 |
| Comparative 1A | 1A | at 25° C. | 19 |
| Reference 1A | 1A | no shot peening | 9 |
| Invention 2A | 2A | at 200° C. | 85 |
| Comparative 2A | 2A | at 25° C. | 32 |

TABLE 2-continued

Summary of cutting test results of Example 2

| Name of sample | Substrate | Shot peening | Average tool life |
|---|---|---|---|
| Reference 2A | 2A | no shot peening | 10 |
| Invention 3A | 3A | at 200° C. | 83 |
| Comparative 3A | 3A | at 25° C. | 61 |
| Reference 3A | 3A | no shot peening | 8 |

As can been seen in the Table 2, the average tool life of the cutting tools that had been treated with the inventive method, shot peening at 200° C., was clearly higher as compared to no shot peening and also compared to shot peening at room temperature.

Example 3 (Working Example)

To study the bulk toughness inserts were prepared, and in this case the shot peeing was performed at 2 bar and for 12 seconds. The inserts were then tested in a milling operation at the following parameters:
Work piece material: Toolox33 PK158 600×200×100 mm MC P2.5. CMC 02.2 Charge 111125
$v_c$=100 m/min
$f_z$=0.25 mm
$a_e$=40 mm
$a_p$=2.0
z=1
length of 1 pass=100 mm
No cutting fluid was used.
Insert type R390-11T308M-PM The tool life criterion was set to chipping of at least 0.5 mm of the edge line. Tool life is presented as the average number of cuts in order to achieve this criteria. The presented average tool life is presented in Table 3 and the tool life is the average number of cuts of 8 parallel cutting test.

TABLE 3

Summary of cutting test results of Example 3

| Name of sample | Substrate | Shot peening at temperature [° C.] | Average tool life |
|---|---|---|---|
| Comparative 1B | 1B | 25° C. | 12.2 |
| Invention 1B | 1B | 300° C. | 16.6 |
| Comparative 2A | 2A | 25° C. | 7.8 |
| Invention 2A | 2A | 300° C. | 12.5 |
| Comparative 2B | 2B | 25° C. | 5.4 |
| Invention 2B | 2B | 300° C. | 14.2 |
| Comparative 2C | 2C | 25° C. | 7.0 |
| Invention 2C | 2C | 300° C. | 11.2 |
| Comparative 2D | 2D | 25° C. | 11.0 |
| Invention 2D | 2D | 300° C. | 19.3 |
| Comparative 3A | 3A | 25° C. | 10.7 |
| Invention 3A | 3A | 300° C. | 17.1 |
| Comparative 3B | 3B | 25° C. | 16.2 |
| Invention 3B | 3B | 300° C. | 30 |

Example 4 (Working Example)

To study the edge line toughness inserts were prepared, and in this case the shot peeing was performed at 2 bar and for 12 seconds. The inserts were then tested in a milling operation at the following parameters:
Work piece material: Dievar unhardened, P3. 0.Z.AN, Charge: F12168
$v_c$=200 m/min
$f_z$=0.20 mm
$a_e$=12 mm
$a_p$=3.0
z=1
length of cut=12 mm
No cutting fluid was used.
Insert type R390-11T308M-MM The tool life criterion was set to chipping of at least 0.5 mm of the edge line. Tool life is presented as the average number of cut entrances in order to achieve these criteria. The presented average number of cuts is an average of 16 parallel cutting test and the average tool life is presented in Table 4.

TABLE 4

Summary of cutting test results of Example 4

| Name of sample | Substrate No. | Shot peening at temperature (° C.) | Average tool life |
|---|---|---|---|
| Reference 1C | 1C | Not shot peened | 1.1 |
| Comparative 1C | 1C | 25° C. | 2.3 |
| Invention 1C105 | 1C | 105° C. | 3.6 |
| Invention 1C150 | 1C | 150° C. | 4.2 |
| Invention 1C200 | 1C | 200° C. | 4.9 |
| Invention 1C250 | 1C | 250° C. | 3.7 |
| Invention 1C300 | 1C | 300° C. | 4.9 |
| Invention 1C400 | 1C | 400° C. | 6.0 |
| Invention 1C500 | 1C | 500° C. | 7.2 |

Example 5 (Vickers Measurements)

The relation between the hardness in the surface area and the hardness in the bulk area was analysed with Vickers measurements, making Vickers indentations on the rake face of the cutting tool and Vickers intendations on a cross section of the cutting tool. The outer alumina layer was removed to improve the measurements of the Vickers indents. The results are presented in Table 5.

Samples were polished using standard methods so that the TiCN layer was exposed on the rake face of the cutting tool. A bulk sample was prepared by cutting the insert perpendicular to the rake face using a diamond wheel and subsequently polishing using 9 μm diamond dispersed in oil on paper and then 1 μm diamond dispersed in oil. Hardness of the polished samples were then measured using a programmable hardness tester, KB30S by KB Prüftechnik GmbH. The measurements were calibrated against HV100 using test blocks issued by Euro Products Calibration Laboratory, UK. Hardness was measured according to ISO EN6507.

HV measurements were performed by programming the hardness tester to perform indentations at certain positions. Indentations are then performed using the specified load after which each indentation is automatically revisited. The computer auto adjusts light, auto focuses and then measures the size of each indentation, a photo is saved and the user inspects all the photos of the indentations for focus and other matters that might disturb the result. Four parallel HV100 indentations were made with a distance from each other (center-center) of about 1.5 mm and the presented result is an average value.

TABLE 5

| Sample | Shot peening at temperature [° C.] | Bulk hardness [HV100] | Surface hardness [HV100] | Coating thickness during hardness measurement [μm] | Difference between bulk and surface hardness [Δ HV100] |
|---|---|---|---|---|---|
| Comparative 2A | 25 | 1497 | 1519 | 5.3 | −22 |
| Invention 2A200 | 200 | 1489 | 1532 | 5.3 | −43 |
| Invention 2A250 | 250 | 1494 | 1535 | 4.9 | −41 |
| Invention 2A300 | 300 | 1492 | 1536 | 5.5 | −44 |
| Invention 2A500 | 500 | 1497 | 1540 | 5.0 | −43 |

Example 6 (Residual Stress Measurements)

X-ray diffraction was used to determine residual stresses in the aforementioned samples through the so-called $\sin^2\psi$-method. In this method the shift of lattice spacings d (and hence the strains) are measured as a function of sample tilt angles ψ. The residual stresses are obtained from the linear slope of the strain vs $\sin^2\psi$ curve. Residual stresses are converted from strain values by using X-ray elastic constants.

The XRD measurements were performed on a Bruker Discover D8 diffractometer with Davinci design equipped with a IμS SMicrofocus Source (CuK$_\alpha$ radiation, λ=1.5418 Å), a Våntec-500 area detector and an ¼ Eulerian cradle. The (2 1 1) reflection of WC located at 117.32° 2θ was used for strain measurements. The residual stress measurements were performed in 1 to 4 angular directions, φ: 0°, 90°, 180°, 270° and for each φ-direction 10 equidistant ψ-angles (0°-50°) were measured, measurement time 400 s. A collimator with 1.0 mm diameter was used in all measurements.

The resulting residual stresses were obtained from strain data by using X-ray elastic constants for WC, Bragg peak (2 1 1). The X-ray elastic constants where calculated from Poisson's ratio v=0.191 and Young's modulus=717.360 GPa.

The samples were mounted with adhesive tape to the sample holder.

The XRD data were analyzed with software DIFFRAC EVA (Bruker) and High Score Plus (Malvern Panalytical). Software LEPTOS 7 (Bruker) was used in the residual stress analysis.

The samples were heat treated at 400° C. for 10 minutes at atmospheric pressure in an oven and in a flow of Ar gas.

The results are presented in Table 6.

TABLE 6

| Sample | Shot peening at temperature [° C.] | Original residual stress [MPa] | Residual stress after heat treatment in 400° C. [MPa] | Ratio of residual stress heat treated/residual stress original [MPa] |
|---|---|---|---|---|
| Comparative 1C | 25 | −3230 | −2921 | 0.90 |
| Invention 1C105 | 105 | −3239 | −2973 | 0.92 |
| Invention 1C200 | 200 | −3280 | −3237 | 0.99 |
| Invention 1C250 | 250 | −3473 | −3294 | 0.95 |
| Invention 1C300 | 300 | −3299 | −3315 | 1.00 |
| Invention 1C400 | 400 | −3325 | −3296 | 0.99 |
| Invention 1C500 | 500 | −3409 | −3342 | 0.98 |

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A method of treating a cutting tool including a cemented carbide or cermet substrate, wherein the cutting tool is subjected to
    i) heating to an elevated temperature of between 100° C. and 600° C.; and
    ii) shot peening at least a portion of the cutting tool, wherein the shot peening is performed at the elevated temperature, and the portion of the cutting tool subjected to the shot peening is at the elevated temperature during the shot peening.

2. The method according to claim 1, wherein the cutting tool includes a rake face, a flank face and a cutting edge extending therebetween, and wherein said shot peening is performed at least on the rake face.

3. The method according to claim 2, wherein a value of edge rounding (ER) of at least a part of said cutting edge is between 10 μm and 50 μm.

4. The method according to claim 1, wherein a material of the cemented carbide or the cermet substrate consists of hard constituents in a metallic binder phase, and wherein the content of the metallic binder phase in the cemented carbide or the cermet substrate is 1-30 vol %.

5. The method according to claim 4, wherein the metallic binder phase is an alloy including at least 80 wt % of one or more metallic elements selected from Co, Ni and Fe.

6. The method according to claim 4, wherein the metallic binder phase is an alloy including one or more metallic elements selected from Co, Ni, Fe, Al, Cr, Ru, W, Mo, Mn, Re, Ti, Ta, Nb, Zr, Hf, Cu, Si.

7. The method according to claim 1, wherein the cutting tool is provided with a coating, and wherein a thickness of said coating is 2-20 μm.

8. The method according to claim 7, wherein the coating is a CVD coating or a PVD coating, said coating having one or more layers selected from TiN, TiCN, TiC, TiAlN, $Al_2O_3$ and ZrCN.

9. The method according to claim 1, wherein the shot peening is performed with a peening media comprising beads of $ZrO_2$, steel or cemented carbide.

10. The method according to claim 1, wherein the shot peening is performed with a peening media having an average diameter of 70-150 μm.

11. The method according to claim 1, further comprising a step of shot blasting at least a portion of the cutting tool.

12. The method according to claim 11, wherein the step of shot blasting is performed subsequent to the shot peening.

13. The method according to claim 12, wherein the shot blasting and the shot peening are performed on same portions of the cutting tool.

14. The method according to claim 1, wherein a material of the cemented carbide substrate has a binder phase of Co of 3-20 wt % Co in the cemented carbide material, and wherein the cemented carbide material includes Cr with a Cr/Co weight ratio of 0.03-0.35.

15. The method according to claim 1, wherein a material of the cemented carbide substrate includes $M_7C_3$ carbides.

16. The method according to claim 1, wherein a material of the cemented carbide substrate has a substoichiometric carbon content, SCC, of −0.13 wt %≤SCC≤0 wt %, or −0.30 wt %≤SCC≤−0.16 wt %.

17. The method according to claim 16, wherein the cemented carbide material has a substoichiometric carbon content, SCC, of −0.28 wt %≤SCC≤−0.17 wt %, and further includes an eta phase.

18. A cutting tool for a metal cutting application treated according to claim 1.

19. A method of treating a cutting tool including a cemented carbide or cermet substrate, wherein the cutting tool is subjected to:
   i) heating to an elevated temperature of or above 100° C. and up to 450° C.; and
   ii) shot peening at least a portion of the cutting tool, wherein the shot peening is performed at the elevated temperature, and the portion of the cutting tool subjected to the shot peening is at the elevated temperature during the shot peening.

* * * * *